United States Patent

Jairazbhoy

Patent Number: 6,049,466
Date of Patent: Apr. 11, 2000

[54] SUBSTRATE WITH EMBEDDED MEMBER FOR IMPROVING SOLDER JOINT STRENGTH

[75] Inventor: Vivek Amir Jairazbhoy, Farmington Hills, Mich.

[73] Assignee: Ford Motor Company, Dearborn, Mich.

[21] Appl. No.: 09/045,187

[22] Filed: Mar. 20, 1998

[51] Int. Cl.⁷ ..................................................... H05K 7/06
[52] U.S. Cl. ........................... 361/774; 361/769; 361/772; 257/669; 257/690; 257/692; 439/81
[58] Field of Search ..................................... 257/669, 688, 257/690, 692, 735, 674, 737, 738, 747, 773, 774; 361/772, 773, 774, 776, 767, 769; 439/68, 69, 73, 72, 80, 81, 161, 449, 452

[56] References Cited

U.S. PATENT DOCUMENTS

| | | |
|---|---|---|
| 3,487,541 | 1/1970 | Boswell . |
| 4,893,172 | 1/1990 | Matsumoto et al. ..................... 257/669 |
| 5,250,847 | 10/1993 | Baskett . |
| 5,294,039 | 3/1994 | Pai et al. . |
| 5,573,172 | 11/1996 | Gore . |
| 5,668,701 | 9/1997 | Fukai . |
| 5,682,061 | 10/1997 | Khandros et al. ....................... 361/772 |
| 5,763,941 | 6/1998 | Fjelstad .................................... 257/773 |
| 5,859,472 | 1/1999 | DiStefano et al. ...................... 257/674 |

*Primary Examiner*—Leo P. Picard
*Assistant Examiner*—John B. Vigushin
*Attorney, Agent, or Firm*—Leslie C. Hodges

[57] ABSTRACT

There is disclosed herein an electronic circuit assembly, comprising: (1) a plastic molded substrate 10 having a first surface 12 with a mounting pad 14 disposed thereon; (2) a reinforcing member 20 having a first member portion 22 and a second member portion 24, wherein the first portion 22 is embedded within the substrate 10 beneath the first surface 12 thereof proximate the mounting pad 14 and wherein the second portion 24 is oriented generally parallel with and at a first predetermined distance $h_1$ above the mounting pad 14; (3) an electronic surface mount component 18 having a termination 16 thereon, the component 18 being oriented such that the termination 16 is disposed at a second predetermined distance $h_2$ above the second member portion 24; and (4) a solder joint 30 connecting the component termination 16 with the mounting pad 14 and the second member portion 24.

19 Claims, 3 Drawing Sheets

SUBSTRATE WITH EMBEDDED MEMBER FOR IMPROVING SOLDER JOINT STRENGTH

BACKGROUND OF THE INVENTION

1. Field of the Invention

The present invention relates generally to electronic circuits. More particularly, the present invention relates to an electronic circuit assembly, such as a printed circuit board, having reinforced solder joints.

2. Disclosure Information

In the conventional manufacture of printed circuit boards (PCBs), electronic surface mount components (SMCs) such as integrated circuit chips, chip resistors, etc. are placed on a PCB substrate with their terminations registered atop corresponding solder-pasted mounting pads, whereupon the PCB is passed through a reflow oven so that the solder paste melts, reflows, and solidifies so as to form solid solder joints which mechanically and electrically connect each SMC termination with its respective mounting pad.

However, it is often the case that the SMCs and the substrate to which they are attached have significantly different coefficients of thermal expansion (CTEs). This induces mechanical stress in the solder joints when the PCB is exposed to thermal cycling, which can eventually lead to cracks in the solder joints.

Various approaches have been proposed for alleviating this problem. For example, metal and other fillers having mechanical strength higher than the solder have been added to the solder paste, in order to make the resulting joint more mechanically robust. Also, attempts have been made to place metal foils, sheets, or screens within the solder joint interposed between the component termination and its respective mounting pad. Other approaches involve attempts at controlling the solder joint height, volume, profile, and/or other solder joint features, as well as altering the mounting pad and/or termination shapes and orientations. Additionally, materials other than solder, such as electrically conductive polymeric adhesives (e.g., silver-filled epoxy), have been used instead of traditional tin/lead solder in order to ameliorate solder joint cracking, but such alternative joint materials often present other drawbacks and limitations. Various other approaches (e.g., underfilling the SMC with an adhesive) are also known in the art for reducing the problem of thermally induced solder joint cracking.

While all of the foregoing approaches have merit in addressing this problem, it is nonetheless desirable to provide additional, alternative approaches which a PCB designer may have at his or her disposal. With the trend increasing that more and more PCBs are being designed with substrates that are injection molded out of thermoplastic or thermoset materials—rather than being produced using the traditional glass/epoxy FR-4 lamination process—it would be further desirable to provide an approach for alleviating solder joint cracking which utilizes some of the advantages of injection molding the substrate.

SUMMARY OF THE INVENTION

The present invention overcomes some of the disadvantages of the prior art approaches and provides a method which takes advantage of molding in members which reinforce the subsequently formed solder joints when the substrate is being molded. The present invention provides an electronic circuit assembly comprising: (1) a plastic molded substrate having a first surface with a mounting pad disposed thereon; (2) a reinforcing member having a first member portion and a second member portion, wherein the first portion is embedded within the substrate beneath the first surface thereof proximate the mounting pad and wherein the second portion is oriented generally parallel with and at a first predetermined distance above the mounting pad; (3) an electronic surface mount component having a termination thereon, the component being oriented such that the termination is disposed at a second predetermined distance above the second member portion; and (4) a solder joint connecting the component termination with the mounting pad and the second member portion.

It is an object and advantage of the present invention that the reinforcing members described herein help reinforce the solder joint against mechanically and/or thermally induced stress so as to significantly prolong solder joint service life.

Another advantage of the present invention is that the members which reinforce the subsequently formed solder joints may be insert molded while the substrate is being molded.

These and other advantages, features and objects of the invention will become apparent from the drawings, detailed description and claims which follow.

DETAILED DESCRIPTION OF THE PREFERRED EMBODIMENTS

Figure 1:
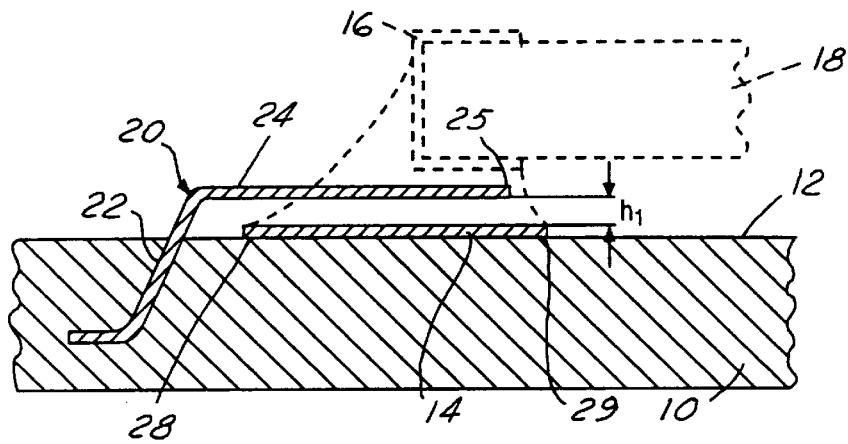
FIG. 1 is a cross-sectional side view of an electronic circuit assembly according to the present invention.

Referring now to the drawings, FIG. 1 shows an electronic circuit assembly according to the present invention. The assembly comprises: a plastic molded substrate 10 having a first surface 12 with a mounting pad 14 disposed thereon (arranged in matched relation with termination 16 of an SMC 18, represented by dashed lines), and a reinforcing member 20 having a first member portion 22 and a second member portion 24. The first portion 22 is embedded within the substrate 10 beneath the first surface 12 thereof proximate the mounting pad 14, and the second portion 24 is oriented generally parallel with and at a predetermined distance $h_1$ above the mounting pad 14.

Figure 2:
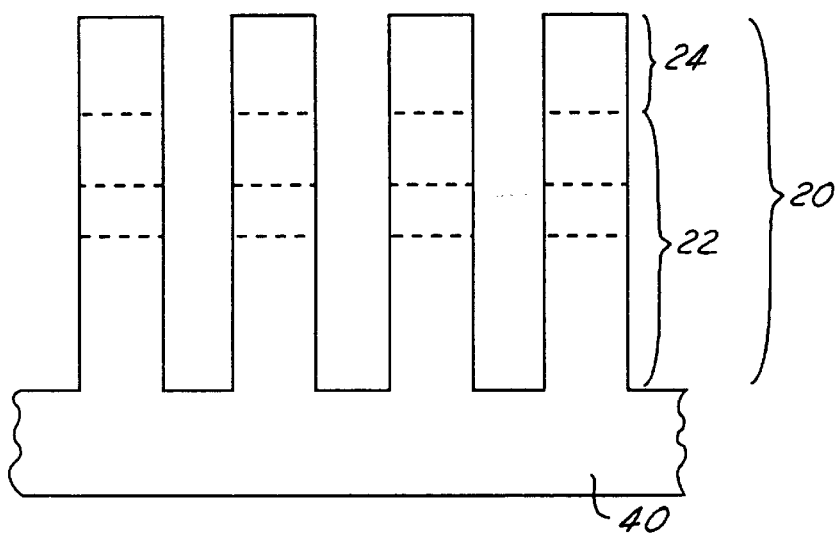
FIG. 2 is a plan view of a metal stamping having reinforcing members carried thereon according to the present invention.
Figure 3:
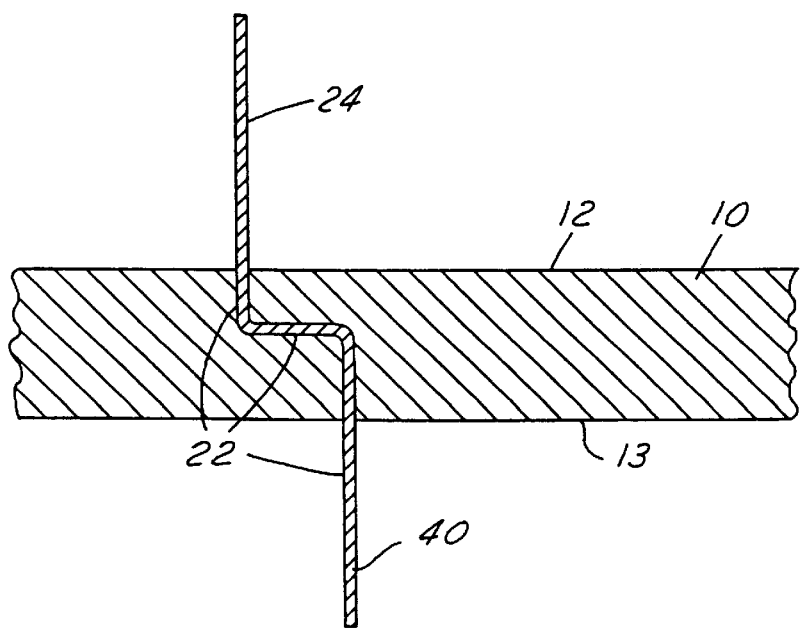
FIGS. 3–4 are cross-sectional side views of a substrate and reinforcing member before and after attachment of a mounting pad on the substrate surface according to one aspect of the present invention.
Figure 4:
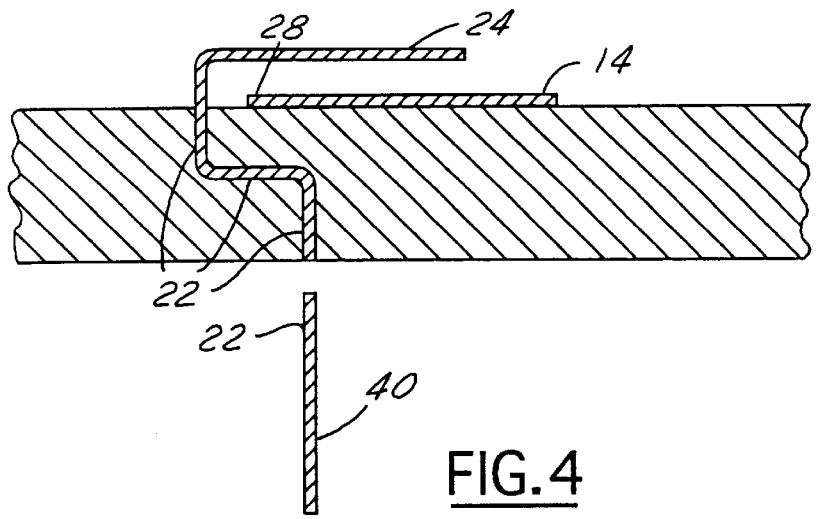
Figure 5A:
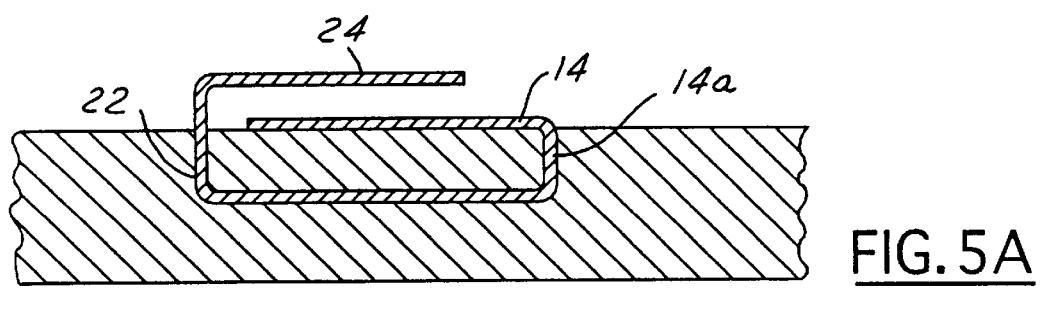
FIGS. 5A–B are cross-sectional side views of two configurations of a substrate and reinforcing member according to the present invention wherein a mounting pad is made integral with the reinforcing member.
Figure 5B:
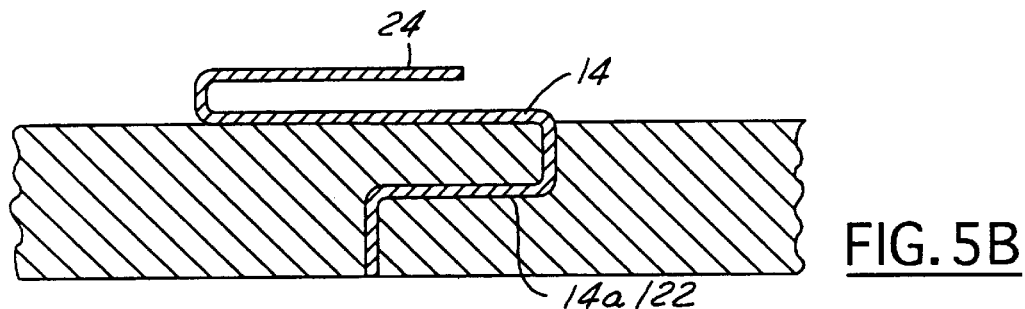

It is preferable that at least the second portion 24 of the reinforcing member 20 be solder-wettable, although, of course, the entire member 20 may be solder-wettable. This may be accomplished by forming the entire member 20 from a single piece of plastic or (preferably) metal (e.g., copper, aluminum, gold) and tinning at least the second portion 24 thereof. When using an SMC 18 having more than one termination 16 on a side, or when more than one SMC are to be laid out on the substrate 10 generally side-by-side, multiple individual members 20 may initially be formed as a single piece or "leadframe" in the form of a single carrier strip 40 with individual members 20 extending outward therefrom (e.g., a metal stamping), as illustrated in FIG. 2. This single-piece leadframe may then be insert-molded into the substrate 10 with the carrier strip 40 and some portion of each first member portion 22 protruding outward from a second surface 13 of the substrate, as illustrated in FIG. 3. After molding, the carrier strip 40 may be severed from the protruding members 22, thus leaving the member portions 22 protruding from the second surface 13, or the member portions 22 may be sheared off or otherwise truncated flush with the second surface. Once the first member portions 22 are embedded within the substrate 10, corresponding mounting pads 14 may be formed on the substrate first surface 12 and thereafter the second member portions 24 bent so as to lie generally parallel with their respective mounting pads 14 at a predetermined height $h_1$ thereabove, as shown in FIG. 4. Alternatively, the mounting pads 14 may be provided with an anchor portion 14a and insert molded along with the members 20, and each mounting pad 14 may even be made integral with its respective member 20 by fabricating the mounting pads and members such that the mounting pad anchor portion 14a is integral with the corresponding first member portion 22, as shown in FIGS. 5A–B.

Figure 6:
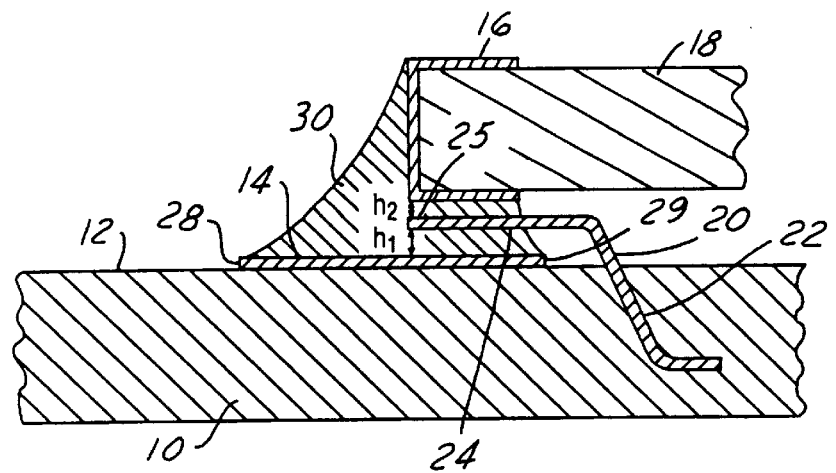
FIGS. 6 and 7A–B are cross-sectional side views of an electronic circuit assembly according to alternate configurations of the present invention.
Figure 7A:
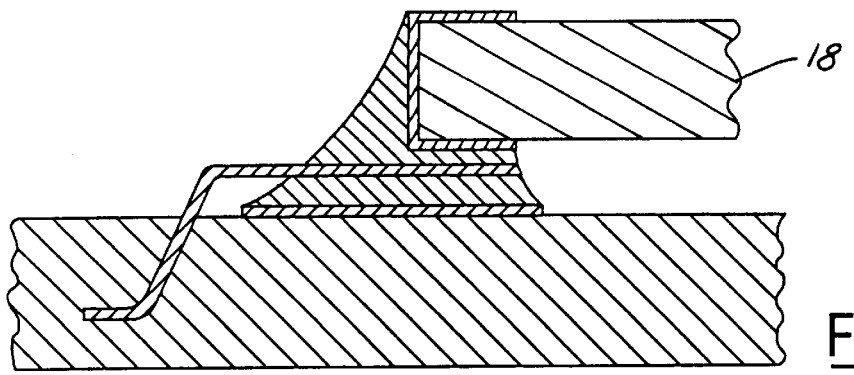
Figure 7B:
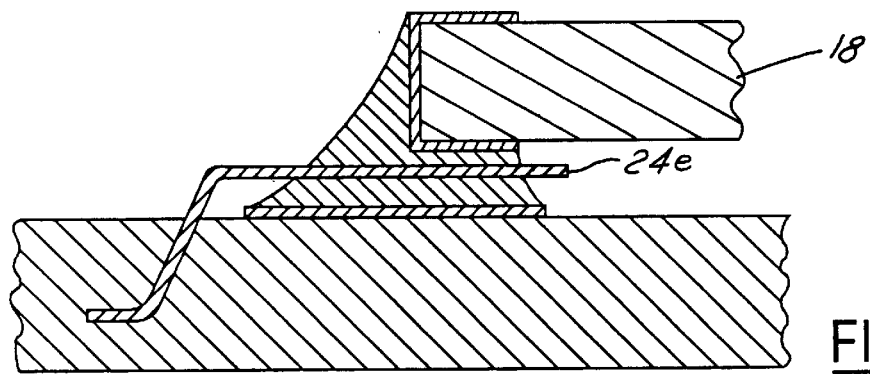

The second portion 24 of each member 20 may project outward from the substrate top surface 12 proximate the outer edge 28 of the mounting pad 14, as shown in FIG. 1, or proximate the inner edge 29 of the mounting pad as shown in FIG. 6, or proximate either lateral edge of the mounting pad (not shown). The second portion 24 of each member 20 is preferably generally coextensive in length and width with (but preferably not longer or wider than) its respective mounting pad 14. Preferably, the second portion 24 protrudes through the substrate first surface 12 proximate but not in contact with a given mounting pad edge (e.g., outer edge 28, as in FIG. 1), and is then bent to extend above and spaced apart from this edge so as to extend above and across the mounting pad to generally the opposite mounting pad edge (e.g., inner edge 29). The leading edge 25 of the second portion 24 may extend such that, upon subsequent solder pasting and reflow operations, the edge 25 extends within, substantially flush with, or protruding beyond an adjacent solder fillet surface 32, as shown in FIGS. 1, 7A, and 7B, respectively. (The configuration shown in FIG. 7B may be achieved by making a given length along the distal end 24e of the second portion 24 non-solder-wettable, such as by selective plating/tinning/masking.) Though not shown in the drawings, the lateral edges of the second portion 24 may likewise extend within, substantially flush with, or protruding beyond their respective solder fillet surfaces. Alternatively, rather than the second member portion 24 extending generally across the length of its respective mounting pad, it may instead enter the inner fillet 32 and extend for a distance between the mounting pad 14 and termination 16 that is significantly less than the full length of the mounting pad, as shown in FIG. 6. Since most solder joint cracks initiate at the inner fillet surface and then propagate under the terminations and then diagonally outward and upward through the outer fillet, it is preferred that the second member portion 24 at least extend proximate the inner fillet surface 32, whether as shown in FIGS. 1 or 6.

Figure 8A:
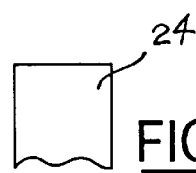
FIGS. 8A–E are alternate partial plan views of second member portions of reinforcing members according to the present invention.
Figure 8B:
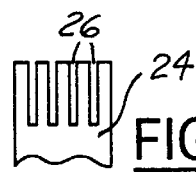
Figure 8C:
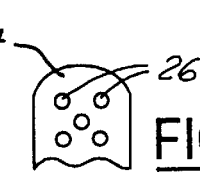
Figure 8D:
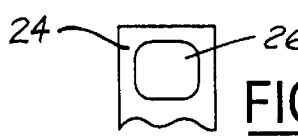
Figure 8E:
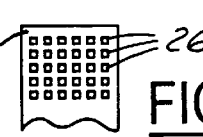

The second member portion 24—and preferably the first member portion 22 as well—are preferably generally thin, flat, and uniform in thickness, thus making the members 20 easily fabricated from metal stampings. Although a wide range of thicknesses and geometries are possible, at least the second member portion 24 may have a thickness generally between 1 and 3 mils. The second portion 24 may also have one or more apertures 26 formed therethrough, in order to aid in the flow of solder from one side of the second portion 24 to the other during subsequent reflow processing. These apertures 26 may be holes or perforations, as illustrated in FIGS. 8C–E, or may be slots or castellations defined by fingers or tine-like structures, as shown in FIG. 8B. As an alternative, the entire member 20 may be fabricated from a metallic screen material (not shown).

Once the electronic circuit assembly as described above is fabricated, an SMC 18 may be attached thereto.

This may be accomplished by applying solder paste, a solder preform, conductive adhesive, or the like to each mounting pad 14 and/or second member portion 24, placing the SMC 18 such that each termination 16 thereof is disposed atop a respective mounting pad/second member portion 14/24 (or, first placing the SMC atop the mounting pads/second member portions and then applying or depositing solder/conductive adhesive/etc. thereto), and then reflow processing the combination so that solder joints 30 are formed connecting each component termination 16 with its respective mounting pad 14 and respective second member portion 24, as illustrated in FIGS. 1, 6, and 7A–B. When the solder joints 30 have solidified, the component terminations 16 will lie at a predetermined distance $h_2$ above their respective second member portions 24; this distance $h_2$ may typically fall generally between 0 and 5 mils, and may be achieved by controlled application of a predetermined volume and layout of solder paste, solder preform, conductive adhesive, or other bonding compound. Such calculations are dependent upon the type of bonding compound, the size and layout of the mounting pads, the size and layout of the component terminations, the type of reflow heating used (e.g., a convective heat reflow oven versus diode laser soldering), the temperature profile to be used, manufacturing and throughput concerns, and so forth, as well known to those skilled in the art to which the present invention pertains.

Figure 9:
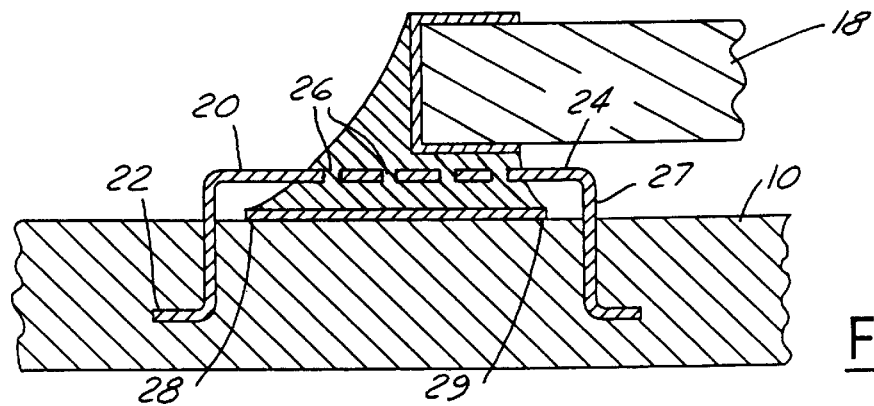
FIG. 9 is a cross-sectional side view of another configuration of the present invention.

Various other modifications to the present invention will, no doubt, occur to those skilled in the art to which the present invention pertains. For example, although the joint 30 connecting each component termination with its respective mounting pad/second member portion has been referred to herein as an initial deposition or application of solder, solder paste, or a solder preform which may be "reflowed" in order to form a "solder joint", it is to be understood that bonding compounds other than solder (e.g., conductive adhesives) and bonding methods other than conventional reflow (e.g., diode lasering or infrared/UV curing) may be used to form the necessary joints, as is well known in the art. Also, instead of insert-molding the reinforcing members 20 during the substrate molding process, the first member portions 22 may be embedded within the substrate 10 subsequent to substrate molding by sufficiently heating the member and pressing it into the substrate, or by ultrasonically pressing the first portion into the substrate, or by other known post-molding means. Additionally, the present invention may be configured with a third portion 27 contiguous with the second portion 24, wherein the third portion 27 is embedded within the substrate similar to the first portion 22, but proximate a mounting pad edge opposite that proximate the first portion 22, as shown in FIG. 9. In such an arrangement, slots or other apertures 26 should preferably be provided in the second portion 24 so that solder/bonding material may flow between either of the two sides of the second portion as needed during reflow. Moreover, it may be desirable to insert-mold one or more thermal planes (e.g., metal sheets, plates, strips, conduits, etc.) within the substrate 10 during substrate molding, or attach thermal planes to the second surface 13 of the substrate after molding, with the first and/or third member portions 22/27 in thermal contact with such thermal planes. This may be done to draw away and dissipate unwanted heat from the SMC. Alternatively, such thermal plane(s) may be made integral with the reinforcing member(s) (e.g., by metal stamping) and may be insert-molded into the substrate. Furthermore, it may be desirable to control the solder-wettability of the second member portion 24 (by selective plating, tinning, masking, etc.) in order to keep the molten solder from wicking too far along that length of the second portion which is to remain outside the final solder joint profile. Other modifications may also be made within the scope of the present invention. It is the following claims, including all equivalents, which define the scope of the present invention.

What is claimed is:

1. An electronic circuit assembly, comprising:
   a plastic molded substrate having a first surface with a mounting pad disposed thereon; and
   a reinforcing member having a first portion and a second portion, wherein said first portion is embedded within said substrate beneath said first surface thereof proximate said mounting pad and wherein said second portion is oriented generally parallel with and at a predetermined distance above said mounting pad, said second portion having at least one aperture therethrough.

2. An electronic circuit assembly according to claim 1, wherein at least said second portion is generally solder-wettable.

3. An electronic circuit assembly according to claim 1, wherein said second portion is generally coextensive in length and width with said mounting pad.

4. An electronic circuit assembly according to claim 1, wherein said second portion extends proximate an inner edge of said mounting pad.

5. An electronic circuit assembly according to claim 1, wherein said member is made of metal.

6. An electronic circuit assembly according to claim 1, wherein said predetermined distance is generally between 1 and 5 mils.

7. An electronic circuit assembly according to claim 1, wherein said mounting pad has an anchor portion embedded within said substrate beneath said first surface thereof, wherein said anchor portion is integral with the first portion of said reinforcing member.

8. An electronic circuit assembly, comprising:
   a plastic molded substrate having a first surface with a mounting pad disposed thereon;
   a reinforcing member having a first portion and a second portion, wherein said first portion is embedded within said substrate beneath said first surface thereof proximate said mounting pad and wherein said second portion is oriented generally parallel with and at a first predetermined distance above said mounting pad;
   an electronic surface mount component having a termination thereon, said component being oriented such that said termination is disposed at a second predetermined distance above said second portion; and
   a solder joint connecting said component termination with said mounting pad and said second portion.

9. An electronic circuit assembly according to claim 8, wherein said first predetermined distance is generally between 1 and 5 mils.

10. An electronic circuit assembly according to claim 8, wherein said second predetermined distance is generally between 0 and 5 mils.

11. An electronic circuit assembly according to claim 8, wherein at least said second portion is generally solder-wettable.

12. An electronic circuit assembly according to claim 8, wherein said second portion is generally coextensive in length and width with said mounting pad.

13. An electronic circuit assembly according to claim 8, wherein said second portion extends proximate an inner edge of said mounting pad.

14. An electronic circuit assembly according to claim 8, wherein said member is made of metal.

15. An electronic circuit assembly according to claim 8, wherein said second portion has at least one aperture therethrough.

16. An electronic circuit assembly according to claim 8, wherein said mounting pad has an anchor portion embedded within said substrate beneath said first surface thereof, wherein said anchor portion is integral with the first portion of said reinforcing member.

17. An electronic circuit assembly, comprising:
   (a) a plastic molded substrate having a first surface with a mounting pad disposed thereon;
   (b) a reinforcing member having a first portion and a second portion,
      (1) wherein said first portion is embedded within said substrate beneath said first surface thereof proximate said mounting pad, and
      (2) wherein said second portion is generally solder-wettable, is oriented generally parallel with and at a first predetermined distance above said mounting pad, and extends proximate an inner edge of said mounting pad;
   (c) an electronic surface mount component having a termination thereon, said component being oriented such that said termination is disposed at a second predetermined distance above said second portion; and
   (d) a solder joint connecting said component termination with said mounting pad and said second portion.

18. An electronic circuit assembly according to claim 17, wherein said first predetermined distance is generally between 1 and 5 mils and wherein said second predetermined distance is between 0 and 5 mils.

19. An electronic circuit assembly according to claim 17, wherein said second portion is generally coextensive in length and width with said mounting pad.

* * * * *